(12) United States Patent
Weiher

(10) Patent No.: US 10,191,102 B2
(45) Date of Patent: Jan. 29, 2019

(54) AUTOMATIC CURRENT TRANSFORMER POLARITY CORRECTION

(71) Applicant: Utility Relay Company, Ltd., Chagrin Falls, OH (US)

(72) Inventor: Helmut Weiher, Burton, OH (US)

(73) Assignee: UTILITY RELAY COMPANY, Chagrin Falls, OH (US)

( * ) Notice: Subject to any disclaimer, the term of this patent is extended or adjusted under 35 U.S.C. 154(b) by 848 days.

(21) Appl. No.: 14/606,207

(22) Filed: Jan. 27, 2015

(65) Prior Publication Data

US 2016/0216306 A1    Jul. 28, 2016

(51) Int. Cl.
*G01R 31/02*      (2006.01)
*H02H 3/08*      (2006.01)
*H02H 3/10*      (2006.01)
*H02H 3/16*      (2006.01)

(52) U.S. Cl.
CPC ............ *G01R 31/025* (2013.01); *H02H 3/083* (2013.01); *H02H 3/165* (2013.01); *H02H 3/105* (2013.01)

(58) Field of Classification Search
CPC ...... G01R 31/025; H02H 3/083; H02H 3/105; H02H 3/165
USPC ........................................................ 361/93.2
See application file for complete search history.

(56) References Cited

U.S. PATENT DOCUMENTS

| | | | |
|---|---|---|---|
| 5,436,785 A * | 7/1995 | Ferrazzi | H02H 3/34 361/42 |
| 7,542,256 B2 | 6/2009 | Premerlani | |
| 7,599,161 B2 | 10/2009 | Premerlani | |
| 8,289,664 B2 | 10/2012 | Haines | |
| 8,300,436 B2 | 10/2012 | Ha | |
| 2007/0021937 A1 * | 1/2007 | Labuschagne | G01R 35/02 702/106 |
| 2012/0271576 A1 * | 10/2012 | Kamel | H02J 13/0006 702/62 |

* cited by examiner

*Primary Examiner* — Kevin J Comber
(74) *Attorney, Agent, or Firm* — Pearne & Gordon LLP

(57) ABSTRACT

A method of processing current transformer data, performed by an electronic trip unit, includes obtaining first current data based on a first current signal from a first current transformer, second current data based on a second current signal from a second current transformer, and third current data based on a third current signal from a third current transformer. Using the current data, it is determined whether one of the current transformers is connected to the electronic trip unit with an improper polarity. Upon determining that one of the current transformers is connected to the electronic trip unit with an improper polarity, the obtained current data corresponding to the current transformer that is connected with improper polarity is automatically inverted. A ground fault calculation is performed using the automatically inverted current data.

18 Claims, 6 Drawing Sheets

AUTOMATIC CURRENT TRANSFORMER POLARITY CORRECTION

BACKGROUND OF THE INVENTION

Field of the Invention

Embodiments of the present invention relate to electrical overcurrent protection devices, and in particular to electronic trip units for circuit breakers.

Description of Related Art

Circuit breakers are used in electrical distribution systems to protect electrical conductors and equipment against the effects of short circuits, ground faults, overloads and/or overcurrent conditions (collectively "abnormal current conditions"). Some circuit breakers have programmable electronic controllers for controlling operations of the circuit breaker. The programmable electronic controllers are known as electronic trip units and circuit breakers employing electronic trip units are known as electronic trip circuit breakers. The electronic trip unit monitors the conditions of an electrical circuit protected by its associated circuit breaker, and signals the circuit breaker to trip upon detecting an abnormal current condition. Current transformers (CTs) are often employed on the conductors of the circuit protected by the circuit breaker to provide a current level signal to the electronic trip unit. Current transformers have a polarity, and it is possible to improperly install a current transformer in the electrical circuit. For example, the CT could be installed backward on a phase conductor of the electrical circuit, or the secondary conductors from the CT could be connected to the electronic trip unit with reversed polarity. In either scenario, the CT will be connected to the electronic trip unit with an improper polarity. Installing CTs with an improper polarity can result in nuisance ground fault tripping until the improperly installed CTs are discovered and corrected.

BRIEF SUMMARY OF THE INVENTION

The following summary presents a simplified summary in order to provide a basic understanding of some aspects of the devices, systems and/or methods discussed herein. This summary is not an extensive overview of the devices, systems and/or methods discussed herein. It is not intended to identify critical elements or to delineate the scope of such devices, systems and/or methods. Its sole purpose is to present some concepts in a simplified form as a prelude to the more detailed description that is presented later.

In accordance with one aspect of the present invention, provided is a method of processing current transformer data. The method includes obtaining, by an electronic trip unit for a circuit breaker, first current data based on a first current signal from a first current transformer on a first phase of a three-phase electrical circuit protected by the circuit breaker. The electronic trip unit obtains second current data based on a second current signal from a second current transformer on a second phase of the three-phase electrical circuit. The electronic trip unit obtains third current data based on a third current signal from a third current transformer on a third phase of the three-phase electrical circuit. The method includes determining, using at least the first current data, the second current data, and the third current data, whether one of the first current transformer, the second current transformer, and the third current transformer is an improper polarity current transformer that is connected to the electronic trip unit with an improper polarity. Upon determining that said one of the first current transformer, the second current transformer, and the third current transformer is an improper polarity current transformer that is connected to the electronic trip unit with an improper polarity, the electronic trip unit automatically inverts obtained current data corresponding to the improper polarity current transformer. The method includes performing a ground fault calculation using automatically inverted current data corresponding to the improper polarity current transformer.

In accordance with another aspect of the present invention, provided is a circuit breaker electronic trip unit that includes a current transformer input for receiving a first current signal from a first current transformer on a first phase of a three-phase electrical circuit, a second current signal from a second current transformer on a second phase of the three-phase electrical circuit, and a third current signal from a third current transformer on a third phase of the three-phase electrical circuit. The trip unit further includes a processor in communication with the current transformer input. The processor is configured to: obtain first current data based on the first current signal, obtain second current data based on the second current signal, and obtain third current data based on the third signal; determine whether one of the first current transformer, the second current transformer, and the third current transformer is connected to the electronic trip unit with an improper polarity using at least the first current data, the second current data, and the third current data; automatically invert obtained current data corresponding to said one of the first current transformer, the second current transformer, and the third current transformer; and perform a ground fault calculation using automatically inverted current data corresponding to said one of the first current transformer, the second current transformer, and the third current transformer. The trip unit further includes a trip signal output operatively connected to the processor, for providing a trip command to a circuit breaker actuator upon detection of a ground fault by the processor.

DETAILED DESCRIPTION OF THE INVENTION

Figure 1:
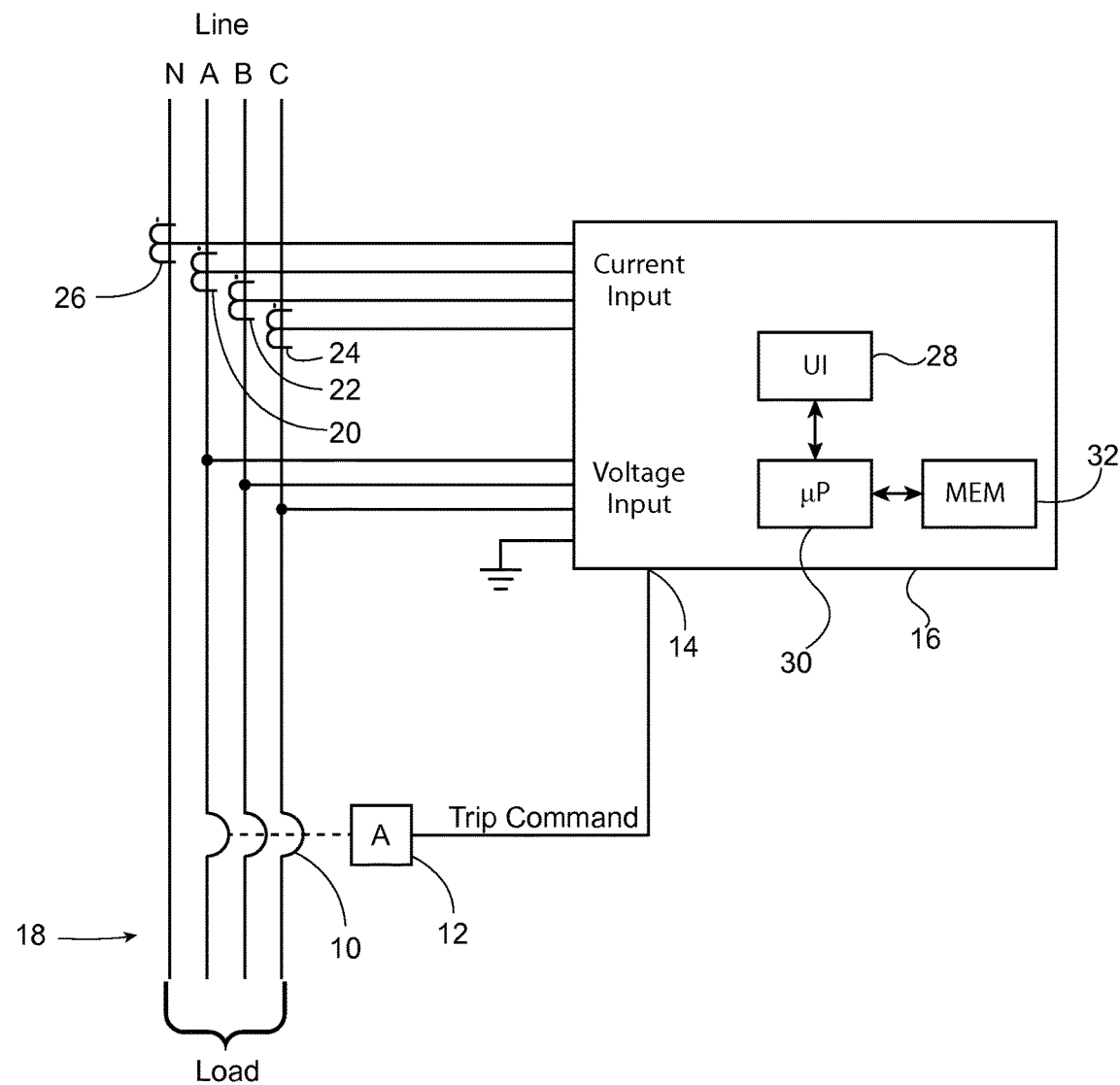
FIG. 1 is a schematic diagram of a circuit protection system.

Embodiments of the present invention relate to electrical overcurrent protection devices including electronic trip units for circuit breakers. The present invention will now be described with reference to the drawings, wherein like reference numerals are used to refer to like elements throughout. It is to be appreciated that the various drawings are not necessarily drawn to scale from one figure to another nor inside a given figure, and in particular that the size of the components are arbitrarily drawn for facilitating the understanding of the drawings. In the following description, for purposes of explanation, numerous specific details are set forth in order to provide a thorough understanding of the present invention. It may be evident, however, that the present invention can be practiced without these specific details. Additionally, other embodiments of the invention are possible and the invention is capable of being practiced and carried out in ways other than as described. The terminology and phraseology used in describing the invention is employed for the purpose of promoting an understanding of the invention and should not be taken as limiting.

FIG. 1 is a schematic diagram of a circuit protection system. The circuit protection system includes a circuit breaker 10 and an actuator 12 for tripping the circuit breaker. The actuator 12 receives a trip command from a trip signal output 14. The trip signal output 14 is located on an electronic trip unit 16, which can generate the trip command. The electronic trip unit 16 and circuit breaker 10 protect a three-phase electrical circuit 18 from abnormal current conditions, based on various trip settings (instantaneous, long time, short time, ground fault, etc.) that are programmed into the trip unit. The three-phase electrical circuit can be a three-wire system without a neutral conductor, or a four-wire system having a neutral conductor (as shown in FIG. 1).

In the embodiment shown in FIG. 1, three electrical phase conductors (phase A, phase B, phase C) are opened by the circuit breaker 10 upon the actuator 12 receiving a trip signal from the electronic trip unit 16. Current transformers (CTs) 20, 22, 24 on the phase conductors provide phase current level signals to the electronic trip unit 16 through a current transformer input section of the trip unit. An additional CT 26 on the neutral conductor provides a neutral current level signal to the electronic trip unit 16. The electronic trip unit 16 uses the phase current level signals and the neutral current level signal on a four-wire circuit to determine the existence of abnormal current conditions. In certain embodiments, the electronic trip unit 16 can measure the line and/or phase voltages of the three electrical phases via a voltage input section, as shown schematically in FIG. 1.

The electronic trip unit 16 includes a user interface device 28 that allows a user to program the trip unit and view information provided by the trip unit. For example, via the user interface device 28, the user can program various trip settings and time delays for tripping the circuit breaker 10. The user interface device 28 can include input devices, such as pushbutton switches and the like, for programming the electronic tip unit 16. The user interface device 28 can further include display devices such as indicator lights, alphanumeric displays, etc., for conveying information to the user. Example information conveyed to the user by the trip unit includes set points, current and voltage levels observed in the protected circuit, consumer energy (e.g., kWh), alarm conditions, etc.

The electronic trip unit 16 includes a processor 30 in communication with the user interface device 28, the current transformer input section, the voltage input section, and the trip signal output. The processor 30 can include one or more microprocessors, microcontrollers or the like. The processor 30 is programmed to execute the various control functions performed by the electronic trip unit 16 and to generate the trip command as needed to trip the circuit breaker 10. For example, the processor 30 can detect the occurrence of a ground fault and generate the trip command to trip the circuit breaker 10. The electronic trip unit 16 includes a memory 32 that is accessible by the processor 30. The memory 32 may store program instructions that cause the processor 30 to provide the functionality ascribed to it herein. The memory 32 may include one or more volatile and/or non-volatile memory portions, such as read-only memory (ROM), random access memory (RAM), electrically-erasable programmable ROM (EEPROM), flash memory, or the like. The electronic trip unit 16 can further include analog-to-digital (A/D) converters (not shown) for the current transformer input section and voltage input section shown in FIG. 1.

The electronic trip unit 16 is capable of detecting a ground fault in the three-phase electrical circuit 18 that is protected by the circuit breaker 10, and generating a trip command to trip the breaker when a ground fault is detected. Several widely used methods for measuring and detecting ground faults include zero sequence, ground return and residual ground fault calculation. The zero sequence and ground return methods directly measure ground faults, whereas the residual ground fault method involves calculating the ground fault current from the phase currents and the neutral current (if a neutral conductor is present in the three-phase circuit). The electronic trip unit 16 discussed herein is configured to perform residual ground fault calculations and trip the circuit breaker 10 if a ground fault is detected.

In the residual ground fault method for a three-wire electrical circuit that lacks a neutral conductor, the ground fault current is determined by calculating a vector sum of the fundamental frequency (e.g., 50 Hz, 60 Hz, etc.) of the three phase currents. On a four-wire circuit, the ground fault current is determined by calculating a vector sum of the fundamental frequency of the three phase currents and the neutral current. In both the three-wire and four-wire systems, the vector sum of the measured currents is equal in magnitude to the ground fault current, and 180° out of phase from the ground fault current. Thus, when the vector sum of the phase and neutral currents and the ground fault current are added together, the result is zero (0). If no ground fault current exists, then the vector sum of the phase and neutral currents will be zero (0).

As shown schematically in FIG. 1, the CTs 20, 22, 24, 26 have a polarity, which is indicated by the dots in FIG. 1. The primary windings of the CTs 20, 22, 24, 26 have a designed line and load side, and the secondary connections of the CTs have corresponding secondary terminals. It is possible to install one or more CTs improperly, with an improper polarity, which can result in nuisance ground fault tripping by the electronic trip unit 16 and circuit breaker 10, when residual ground fault calculations are performed. It can be difficult or inconvenient to troubleshoot and diagnose improperly installed CTs, especially CTs located on the neutral conductor, which may be remote from the circuit breaker and not easily accessible. In a conventional circuit protection system, improperly installed CTs must be corrected in order for the system to operate properly. However, the electronic trip unit 16 discussed herein is capable of automatically identifying an improperly installed CT and inverting its current data to mathematically account for the incorrect polarity. The electronic trip unit 16 can also record (e.g., in the memory 32) that a CT is improperly installed and invert its corresponding current data in future operations.

Figure 2:
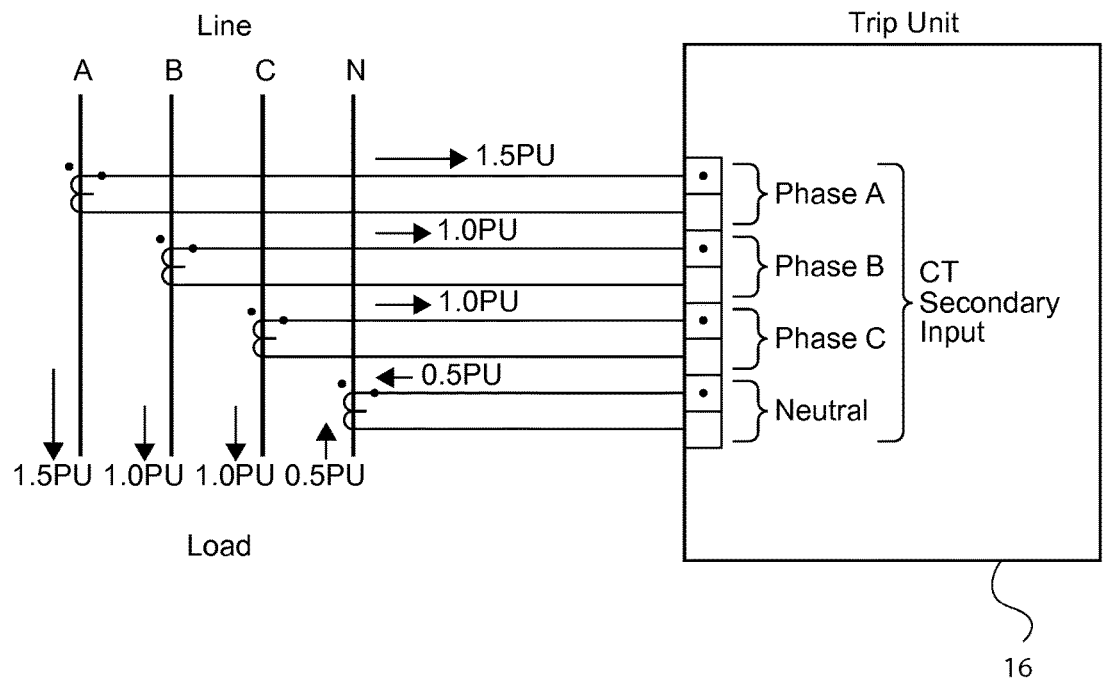
FIG. 2 is a schematic diagram of a portion of a circuit protection system.

FIG. 2 schematically shows a portion of the circuit protection system, in particular the connections between the electronic trip unit 16 and CTs 20, 22, 24, 26 and the polarity of the CTs. As in FIG. 1, the line sides of the CTs are indicated by a dot. It can be seen that all of the CTs are correctly installed, with the dots directed toward the line side of the three-phase electrical circuit. The secondary terminals corresponding to the line side of each CT are also indicated by a dot, and the associated terminals on the electronic trip unit 16 are further identified by a similar dot. The secondary terminal corresponding to the load side of each CT, and the associated terminal on the electronic trip unit 16, are not identified by a dot. Thus, it can be seen that each CT 20, 22, 24, 26 in FIG. 2 is installed and connected to the trip unit with proper polarity.

Example phase currents are also shown in FIG. 2 in per unit (PU), and the electronic trip unit can perform residual ground fault calculations using per unit current measurements. Per unit values are shown and discussed herein for ease of explanation. It is to be appreciated that the electronic trip unit 16 can perform residual ground fault calculations and additional calculations (e.g., power calculations) using other types of current measurements, such as RMS measurements for example.

Figure 3:
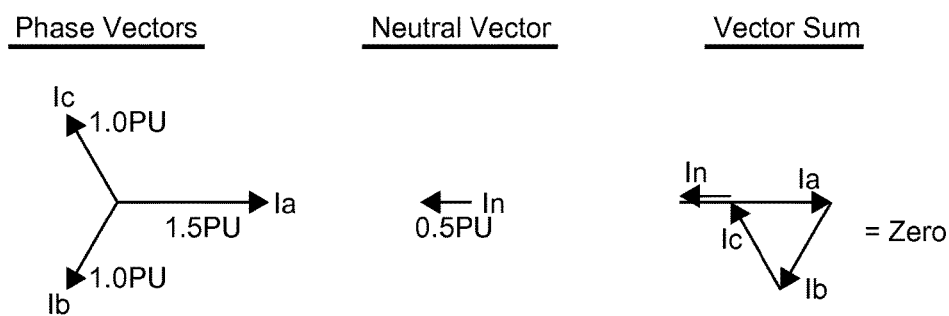
FIG. 3 shows vector diagrams.

It can be seen that the phase current on phase A is 1.5 PU, the phase current on phase B is 1.0 PU, and the phase current on phase C is 1.0 PU. Due to the unbalanced electrical load, a neutral current of 0.5 PU returns to the electric source (not shown). FIG. 3 provides vector diagrams of the phase (Ia, Ib, Ic) and neutral (In) currents. The phase current vectors are spaced 120° apart, and the neutral current vector is 180° out of phase with the phase A current (Ia). It can be seen that the vector sum of the three phase currents and the neutral current equals zero (0). Thus, there is no ground fault current. The electronic trip unit can calculate the vector sum of the phase and neutral currents to determine whether there is a ground fault.

In an example embodiment, the electronic trip unit 16 samples the phase and neutral currents multiple times during the period (1/50 sec., 1/60 sec., etc.) of the AC power waveform. A discrete Fourier transform algorithm can be applied to the sampled currents to eliminate harmonics and isolate the fundamental frequency of the power waveform. From the sampled phase and neutral current signals, the electronic trip unit 16 obtains data (e.g., current data) comprising magnitude values of the current spanning the entire AC cycle for each electrical phase and the neutral conductor (if present). From this sampled data, an overall magnitude of the phase currents, the neutral current, and the ground fault current can be calculated using known techniques. Moreover, by applying known trigonometric functions to the obtained data, the phase angles of the phase currents, the neutral current, and the ground fault current can be calculated by the electronic trip unit 16. With the magnitudes and phase angles of the phase currents, neutral current, and ground fault current known, the electronic trip unit 16 can make a determination regarding the existence of a ground fault. Various other methodologies for performing residual ground fault calculations using sampled phase and neutral current data will be apparent to those of ordinary skill in the art and are considered to be included within the scope of the present invention.

Figure 4:
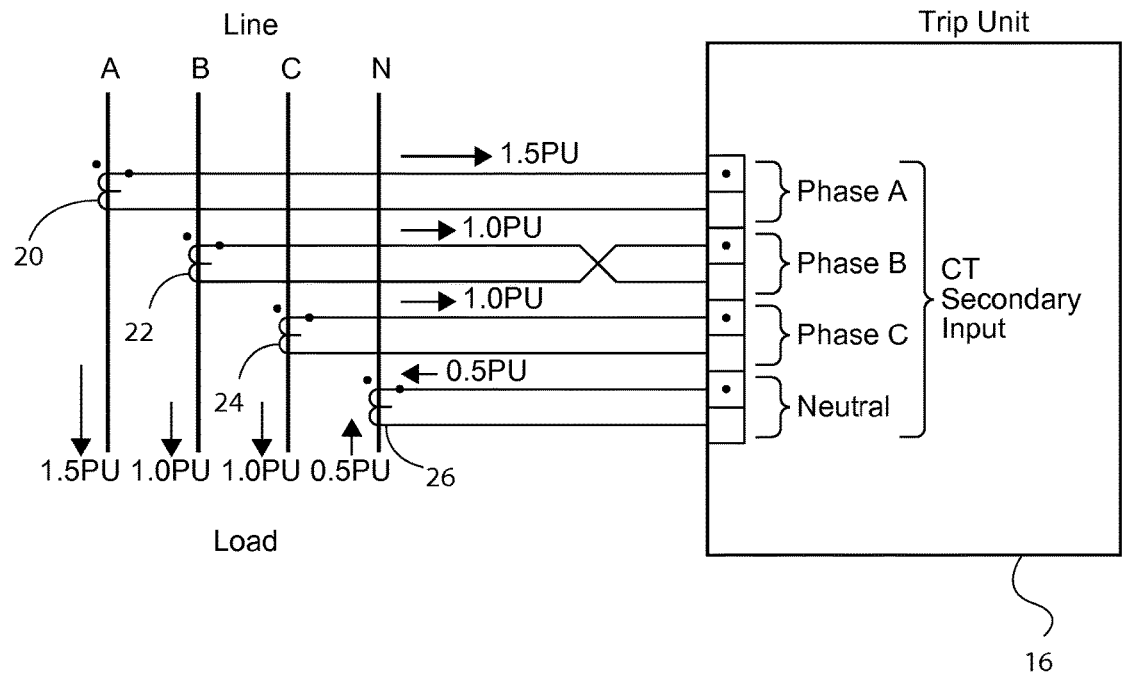
FIG. 4 is a schematic diagram of a portion of a circuit protection system.

Turning to FIG. 4, FIG. 4 shows the same portion of the circuit protection system as shown in FIG. 2. However, in FIG. 4, the CT 22 on phase B is connected to the electronic trip unit 16 with improper (i.e., reversed) polarity. In particular, the secondary terminals of the CT 22 are connected to the electronic trip unit 16 with reversed polarity. The magnitude of the phase and neutral currents in FIG. 4 are the same as in FIG. 2. However, because the CT 22 in FIG. 4 is connected to the electronic trip unit 16 with improper polarity, the electronic trip unit determines the phase angle of the phase B current in FIG. 4 to be 180° different from the phase B current in FIG. 2. That is, the phase B current in FIG. 4 appears to be inverted with respect to the phase B current in FIG. 2, due to the improper polarity of the CT 22.

Figure 5:
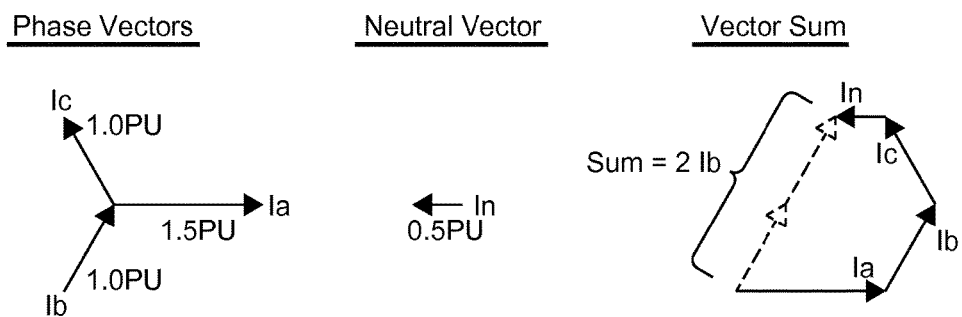
FIG. 5 shows vector diagrams.

The vector sum of the phase and neutral currents in FIG. 4, as can be calculated by the electronic trip unit 16, are shown in FIG. 5. Because the phase B CT 22 is connected with reversed polarity, the vector sum of the phase and neutral currents does not equal zero (0). Indeed, the magnitude of the vector sum is twice that of the magnitude of the current on phase B. Moreover, the phase angle of the vector sum is equal to the apparent (inverted) phase angle of the current on phase B. A conventional electronic trip unit may initiate a nuisance ground fault trip under such circumstances, due to the perceived substantial level of ground fault current. However, a ground fault current greater in magnitude than any of the phase currents is not possible. The electronic trip unit 16 is programmed to recognize that a calculated ground fault current magnitude that is greater than the individual magnitudes of the phase currents is indicative of a current transformer installed with reversed polarity. The electronic trip unit 16 can respond with remedial processing to automatically account for the CT 22 with reversed polarity, without generating a nuisance trip. For example, the electronic trip unit 16 can determine which CT has reversed polarity by comparing the magnitude and phase angle of the vector sum of the phase and neutral currents to the magnitudes and phase angles of the individual phase currents. A phase has a reversed CT when the magnitude of its current is one-half the magnitude of the vector sum of the phase currents (and neutral current if present), and the phase angle of its current matches the phase angle of the vector sum. In FIGS. 4 and 5, the magnitude of the vector sum of the phase and neutral currents is equal to 2.0 PU, which is double the magnitude of the phase current on phase B (1.0 PU). Moreover, the apparent phase angle of the current on phase B is equal to the phase angle of the vector sum of the phase and neutral currents. Thus, phase B must have a reversed CT. By performing such calculations, (e.g., by determining which phase current has the same phase angle and half the magnitude of the vector sum of the phase and neutral currents), the electronic trip unit can automatically determine which phase CT has reversed polarity. Upon determining which CT is reversed, the electronic trip unit 16 can automatically invert the current data corresponding to the reversed CT, so that residual ground fault and power calculations, for example, are performed correctly. The electronic trip unit 16 can invert the current data corresponding to the reversed CT in any number of ways. For example, the current data can be multiplied by −1 to invert the data, or 180° can be added/subtracted from its phase angle to invert the data. Alternatively, a function or operation which has the effect of inverting the current data can be applied to the current data or data derived therefrom during residual ground fault calculations.

By using the automatically inverted data corresponding to the CT with reversed polarity, the electronic trip unit 16 can accurately perform residual ground fault calculations despite the presence of the CT with reversed polarity. The electronic trip unit 16 can record in memory that the CT is improperly installed and invert the corresponding current data in future operations. Thus, the reversed polarity CT need not be physically corrected (i.e., it can be left in a state of reversed polarity). In certain embodiments, the electronic trip unit 16 can generate an alarm indicating that a particular CT is installed with reversed polarity, so that the user can decide whether to correct the polarity.

If the electronic trip unit 16 has a voltage input section as shown in FIG. 1, and can measure phase voltages and perform power calculations, the electronic trip unit can determine an improper CT polarity from a power flow calculation. The electronic trip unit 16 can determine the power flow directions for each phase from the voltage and current inputs. If the direction of power flow is different (opposite) in one phase than the other two phases, the electronic trip unit 16 recognizes that the CT polarity is reversed on that phase. The electronic trip unit 16 then automatically inverts the current data for the reversed CT as described above, prior to performing a residual ground fault calculation. When performing power calculations, the electronic trip unit 16 can internally adjust the direction of power flow for the phase having the reversed CT, similar to automatically inverting the current data. The electronic trip unit 16 can also perform consumed power calculations using the automatically inverted current data.

Figure 6:
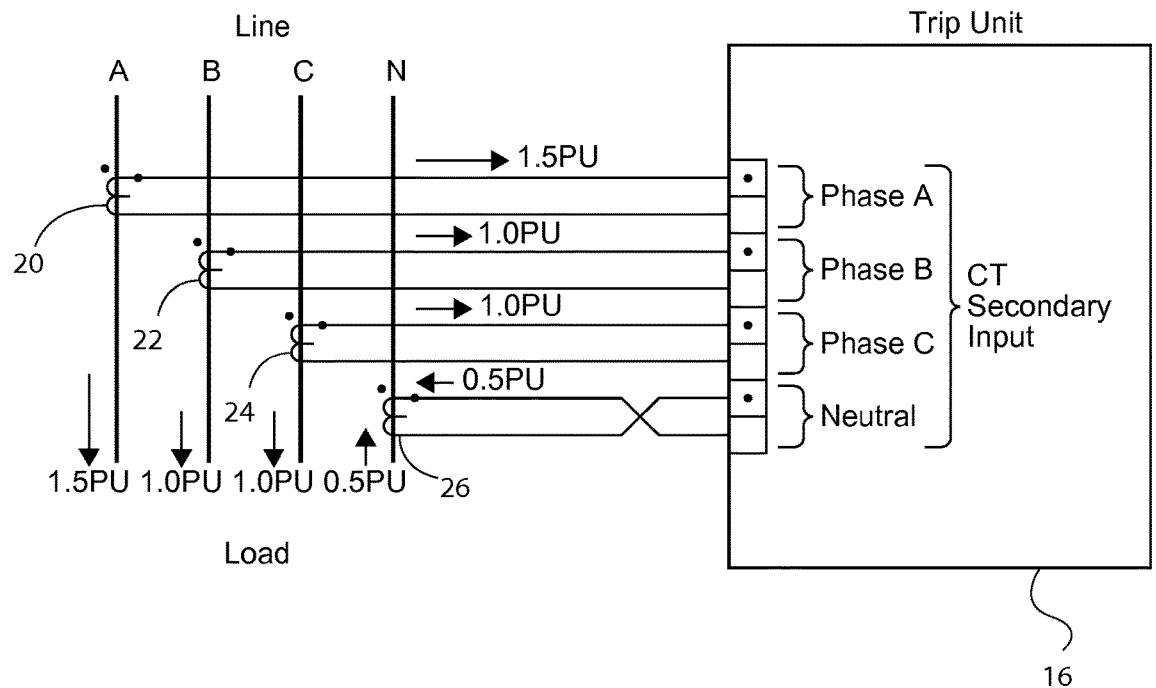
FIG. 6 is a schematic diagram of a portion of a circuit protection system.
Figure 7:
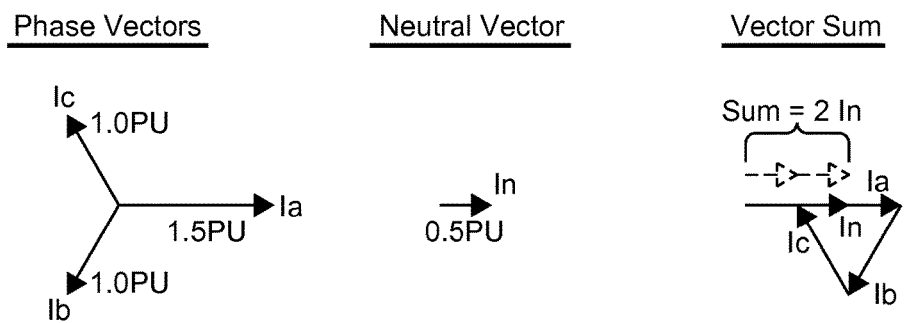
FIG. 7 shows vector diagrams.

FIGS. 6 and 7 show a further example configuration of the trip unit 16 and CTs 20, 22, 24, 26. In FIG. 6, the CTs 20, 22, 24 on the phase conductors are connected with correct polarity. However, the CT 26 on the neutral conductor is connected with reversed polarity. The corresponding phase and neutral current vectors are shown in FIG. 7, along with the sum of the vectors as would be determined by residual a ground fault current calculation performed by the electronic trip unit 16. The vector sum of current vectors in FIG. 7 has a magnitude 2 times (double) the neutral current magnitude and with the same phase angle as the neutral current. The electronic trip unit 16 recognizes that when the magnitude of the calculated vector sum of the phase and neutral currents is double the magnitude of the measured neutral current and at the same phase angle as the measured neutral current, the neutral CT is connected with reversed polarity.

Other methods of determining a reversed neutral CT will be apparent to those of ordinary skill in the art. For example, the electronic trip unit 16 could calculate the vector sum of the three phase currents, which results in the negative of the expected neutral current vector. The electronic trip unit 16 could then compare both the magnitude and phase angle of the calculated vector sum of the phase currents to the measured neutral current vector. If the magnitudes of the vector sum and neutral current are equal and the angle between the vectors is 180°, then the neutral CT polarity connection is correct. If the magnitude of the vector sum of the phase currents is equal to the magnitude of the neutral current vector, and the angle between the vector sum of the phase currents and neutral current vector is 0°, then the neutral CT polarity connection is reversed. If the magnitudes of the vector sum and the neutral current vector are not equal and/or the angle between them is not 180° or 0°, then there is ground fault current and residual ground fault calculations should be made without inverting any neutral current data. If the electronic trip unit 16 determines that the neutral CT 26 is installed with reversed polarity, the trip unit can automatically invert the neutral current data (e.g., as described above with respect to an inverted phase CT), when performing residual ground fault calculations and other calculations.

Figure 8:
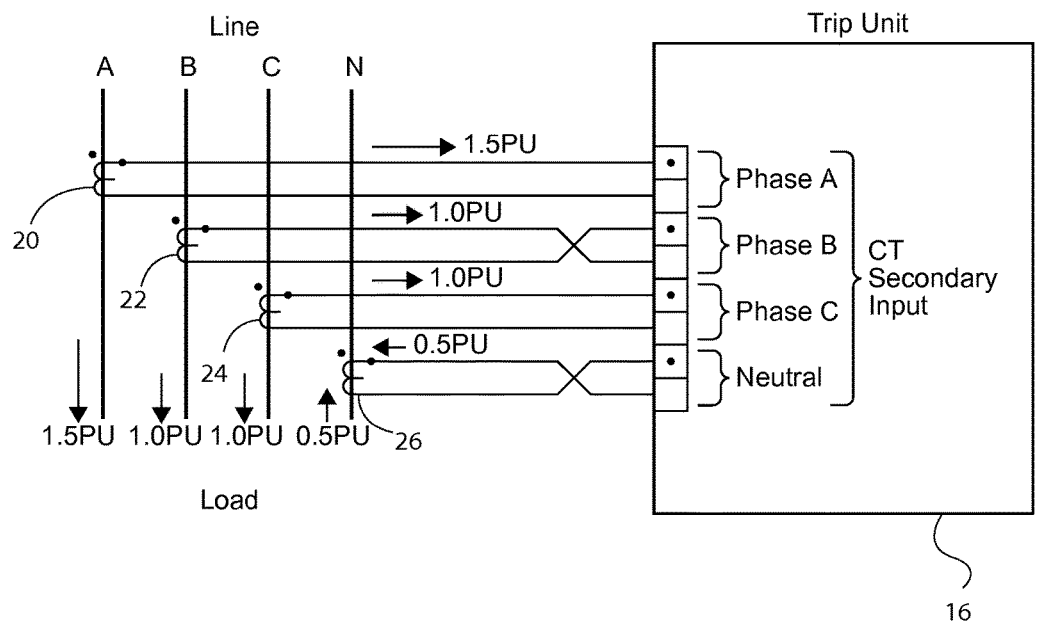
FIG. 8 is a schematic diagram of a portion of a circuit protection system.
Figure 9:
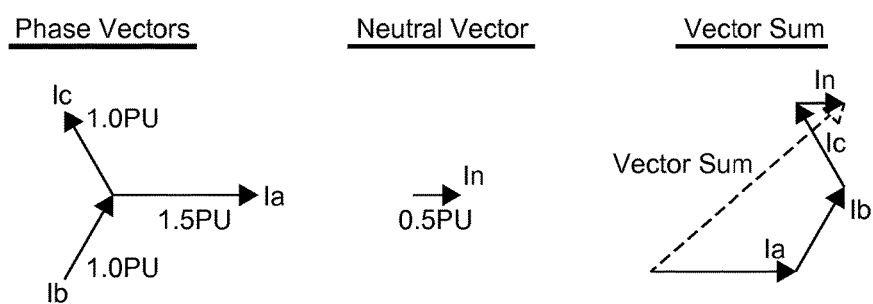
FIG. 9 shows vector diagrams.

FIGS. 8 and 9 show a still further example configuration of the trip unit 16 and CTs 20, 22, 24, 26. In FIG. 8, the CTs 20, 24 on the phase A and C conductors are connected with correct polarity. However, the CTs 22, 26 on the phase B and neutral conductors are connected with reversed polarity. The corresponding phase and neutral current vectors are shown in FIG. 9, along with the sum of the vectors as would be determined by residual a ground fault current calculation performed by the electronic trip unit 16. The electronic trip unit 16 can determine that a phase CT and neutral CT are installed with improper polarity by first determining that the phase CT is reversed. The electronic trip unit 16 can determine that both a phase CT is installed with improper polarity by using one of the techniques discussed above (e.g., by analyzing the vector sum of the phase and neutral currents, or analyzing the power flow directions of the phases). The electronic trip unit 16 can account or adjust for the reversed phase CT by inverting the corresponding phase current data. With the phase current data inverted, the electronic trip unit 16 can then determine whether the neutral current CT is connected with reversed polarity using the techniques discussed above.

Figure 10:
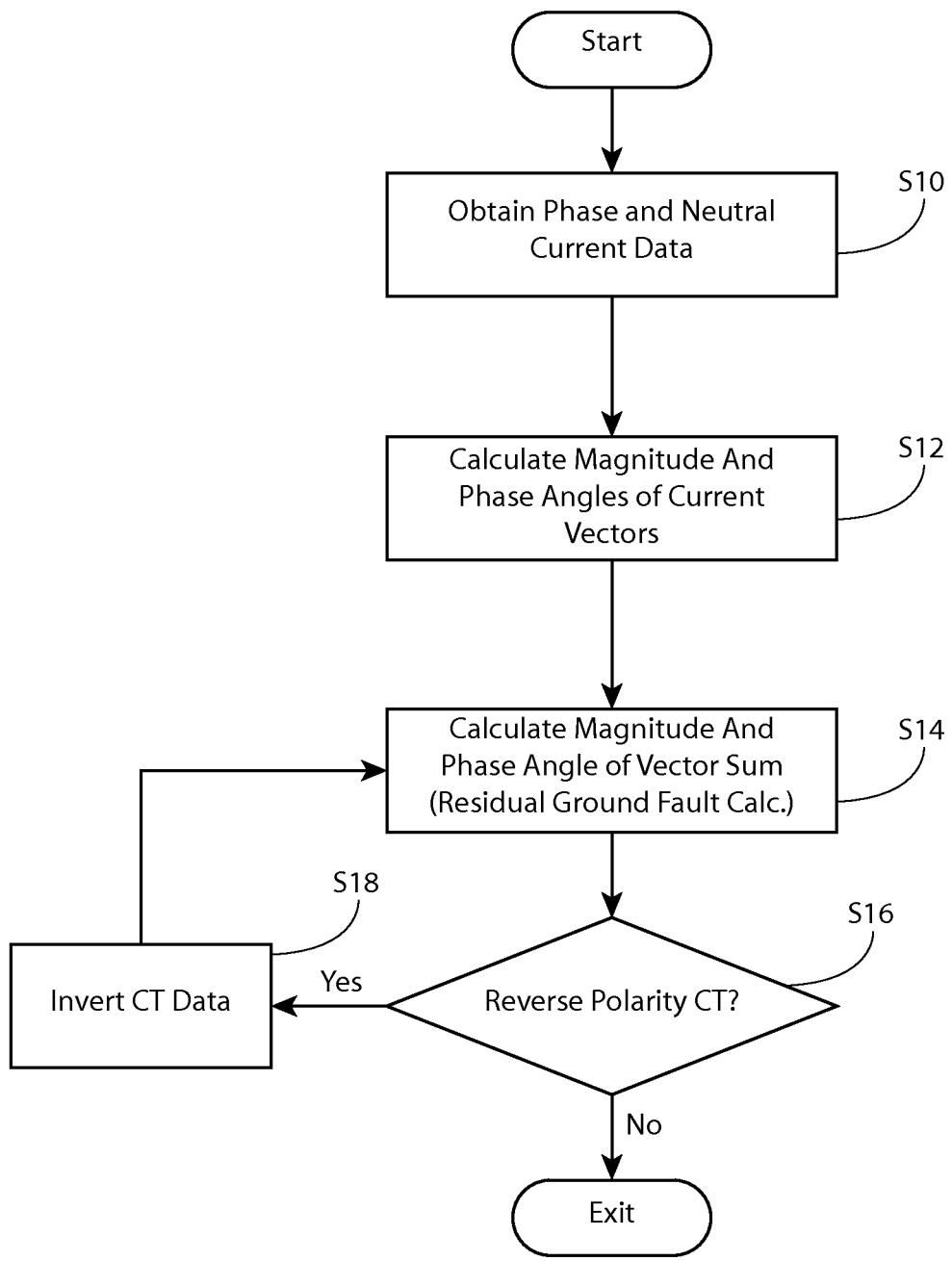
FIG. 10 is a flowchart.

FIG. 10 is a flowchart of an example method for detecting that a CT is installed with reversed polarity and processing current data corresponding to such a CT. In step S10, the electronic trip unit obtains phase and neutral current data from signals generated by the CTs. In step S12, the electronic trip unit calculates the magnitude and phase angles of the phase and neutral current vectors from the obtained phase and neutral current data. In step S14, the electronic trip unit performs a residual ground fault calculation using the phase and neutral current vectors. That is, the electronic trip unit calculates the magnitude and phase angle of the vector sum of the phase and neutral current vectors. The electronic trip unit can calculate said magnitude and phase angle of the vector sum by performing vector addition or through numerical calculations performed on sampled CT current data. Initially, the residual ground fault calculation performed in step S14 is not used to generate a ground fault trip command. Rather, the result of the initial residual ground fault calculation is tested in step S16 to determine whether a phase or neutral CT is installed with reversed polarity. There are various methods for determining whether a CT is installed with reversed polarity, some examples of which are discussed above. If the electronic trip unit determines that all of the CTs are installed with correct polarity, then the result of the residual ground fault calculation can be used in a tripping algorithm. For example, the result of the residual ground fault calculation can be compared to a tripping threshold. However, if the electronic trip unit determines that a CT is installed with reversed polarity (i.e., that the CT is an improper polarity CT), the obtained current data corresponding to the improper polarity CT is automatically inverted by the electronic trip unit (step S18). The residual ground fault calculation can then be performed again using the automatically inverted current data corresponding to the improper polarity CT.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:
1. A method of processing current transformer data, comprising the steps of:
obtaining, by an electronic protection controller for a circuit breaker, first current data based on a first current signal from a first current transformer on a first phase of a three-phase electrical circuit protected by the circuit breaker;
obtaining, by the electronic protection controller, second current data based on a second current signal from a second current transformer on a second phase of the three-phase electrical circuit;

obtaining, by the electronic protection controller, third current data based on a third current signal from a third current transformer on a third phase of the three-phase electrical circuit;

determining, using at least the first current data, the second current data, and the third current data, whether one of the first current transformer, the second current transformer, and the third current transformer is an improper polarity phase current transformer that is connected to the electronic protection controller with an improper polarity by determining whether a magnitude of a vector sum of a first phase current on the first phase of the three-phase electrical circuit, a second phase current on the second phase of the three-phase electrical circuit, and a third phase current on the third phase of the three-phase electrical circuit is greater than each individual magnitude of the first phase current, the second phase current, and the third phase current;

upon determining that said one of the first current transformer, the second current transformer, and the third current transformer is an improper polarity phase current transformer that is connected to the electronic protection controller with an improper polarity, automatically inverting, by the electronic protection controller, obtained current data corresponding to the improper polarity phase current transformer;

performing a ground fault calculation using automatically inverted current data corresponding to the improper polarity phase current transformer;

generating a trip command, by a trip signal output, upon detection of the ground fault, and providing the trip command to a circuit breaker actuator.

2. The method of claim 1, wherein the ground fault calculation is a residual ground fault calculation using the vector sum of the first phase current on the first phase of the three-phase electrical circuit, the second phase current on the second phase of the three-phase electrical circuit, and the third phase current on the third phase of the three-phase electrical circuit.

3. The method of claim 2, wherein the step of determining whether one of the first current transformer, the second current transformer, and the third current transformer is an improper polarity phase current transformer that is connected to the electronic protection controller with an improper polarity includes determining whether a magnitude of calculated residual ground fault current is equal to double an individual magnitude of the first phase current, the second phase current, or the third phase current.

4. The method of claim 2, wherein the step of determining whether one of the first current transformer, the second current transformer, and the third current transformer is an improper polarity phase current transformer that is connected to the electronic protection controller with an improper polarity includes determining whether a phase angle of the calculated residual ground fault current is equal to a phase angle of one of the first phase current, the second phase current, and the third phase current.

5. The method of claim 1, further comprising the steps of:
obtaining, by the electronic protection controller, neutral current data based on a neutral current signal from a neutral current transformer on a neutral conductor of the three-phase electrical circuit;

determining, using at least the first current data, the second current data, the third current data, and the neutral current data, whether the neutral current transformer is connected to the electronic protection controller with reversed polarity; and upon determining that the neutral current transformer is connected to the electronic protection controller with reversed polarity, automatically inverting, by the electronic protection controller, the neutral current data.

6. The method of claim 5, wherein the ground fault calculation is performed using both of:
the automatically inverted current data corresponding to the improper polarity phase current transformer; and
automatically inverted improper polarity neutral current data.

7. The method of claim 1, further comprising the steps of:
measuring, by the electronic protection controller, a first voltage corresponding to the first phase of the three-phase electrical circuit;

measuring, by the electronic protection controller, a second voltage corresponding to the second phase of the three-phase electrical circuit; and measuring, by the electronic protection controller, a third voltage corresponding to the third phase of the three-phase electrical circuit, wherein the step of determining whether one of the first current transformer, the second current transformer, and the third current transformer is an improper polarity phase current transformer that is connected to the electronic protection controller with an improper polarity includes determining whether a power flow direction in one of the first phase, the second phase, and the third phase is opposite from power flow directions in other phases.

8. The method of claim 7, wherein the ground fault calculation is a residual ground fault calculation using a vector sum of a first phase current on the first phase of the three-phase electrical circuit, a second phase current on the second phase of the three-phase electrical circuit, and a third phase current on the third phase of the three-phase electrical circuit.

9. The method of claim 7, further comprising the step of performing, by the electronic protection controller, a consumed power calculation using the automatically inverted current data corresponding to the improper polarity phase current transformer.

10. The method of claim 7, further comprising the steps of:
obtaining, by the electronic protection controller, neutral current data based on a neutral current signal from a neutral current transformer on a neutral conductor of the three-phase electrical circuit;

determining, using at least the first current data, the second current data, the third current data, and the neutral current data, whether the neutral current transformer is connected to the electronic protection controller with reversed polarity; and upon determining that the neutral current transformer is connected to the electronic protection controller with reversed polarity, automatically inverting, by the electronic protection controller, the neutral current data.

11. A circuit breaker electronic protection controller, comprising:
a current transformer input for receiving a first current signal from a first current transformer on a first phase of a three-phase electrical circuit, a second current signal from a second current transformer on a second phase of the three-phase electrical circuit, and a third current signal from a third current transformer on a third phase of the three-phase electrical circuit;

a processor in communication with the current transformer input, wherein the processor is configured to:

obtain first current data based on the first current signal, obtain second current data based on the second current signal, and obtain third current data based on the third current signal, determine whether one of the first current transformer, the second current transformer, and the third current transformer is connected to the electronic protection controller with an improper polarity using at least the first current data, the second current data, and the third current data, automatically invert obtained current data corresponding to said one of the first current transformer, the second current transformer, and the third current transformer;

obtain neutral current data based on a neutral current signal from a neutral current transformer on a neutral conductor of the three-phase electrical circuit, determine whether the neutral current transformer is connected to the electronic protection controller with reversed polarity, from the first current data, the second current data, the third current data, and the neutral current data;

automatically invert obtained neutral current data if the neutral current transformer is determined to be connected to the electronic protection controller with reversed polarity; and perform a ground fault calculation using automatically inverted current data corresponding to said one of the first current transformer, the second current transformer, and the third current transformer; and a trip signal output operatively connected to the processor, for providing a trip command to a circuit breaker actuator upon detection of a ground fault by the processor.

12. The circuit breaker electronic protection controller of claim 11, wherein the ground fault calculation performed by the processor is a residual ground fault calculation using a vector sum of a first phase current on the first phase of the three-phase electrical circuit, a second phase current on the second phase of the three-phase electrical circuit, and a third phase current on the third phase of the three-phase electrical circuit.

13. The circuit breaker electronic protection controller of claim 12, wherein the processor determines that said one of the first current transformer, the second current transformer, and the third current transformer is connected to the electronic protection controller with improper polarity based on a magnitude of a vector sum of the first phase current, the second phase current, and the third phase current being greater than each individual magnitude of the first phase current, the second phase current, and the third phase current.

14. The circuit breaker electronic protection controller of claim 12, wherein the processor determines that said one of the first current transformer, the second current transformer, and the third current transformer is connected to the electronic protection controller with improper polarity based on a determination that a magnitude of calculated residual ground fault current is equal to double an individual magnitude of the first phase current, the second phase current, or the third phase current.

15. The circuit breaker electronic protection controller of claim 12, wherein the processor further determines that said one of the first current transformer, the second current transformer, and the third current transformer is connected to the electronic protection controller with improper polarity based on a determination that a phase angle of calculated residual ground fault current is equal to a phase angle of one of the first phase current, the second phase current, and the third phase current.

16. The circuit breaker electronic protection controller of claim 11, wherein the processor determines that said one of the first current transformer, the second current transformer, and the third current transformer is connected to the electronic protection controller with improper polarity based on detecting a reverse power flow direction in an electrical phase corresponding to said one of the first current transformer, the second current transformer, and the third current transformer.

17. The circuit breaker electronic protection controller of claim 16, wherein the processor is further configured to calculate consumed power using the automatically inverted current data corresponding to said one of the first current transformer, the second current transformer, and the third current transformer.

18. The circuit breaker electronic protection controller of claim 11, wherein the processor is further configured to:

determine that the neutral current transformer is connected to the electronic protection controller with reversed polarity when a magnitude of a vector sum of the first current on the first phase of the three-phase electrical circuit, the second current on the second phase of the three-phase electrical circuit, the third current on the third phase of the three-phase electrical circuit, and the neutral current on the neutral conductor of the three-phase electrical circuit is two times a magnitude of the neutral current and with the same phase angle as the neutral current.

\* \* \* \* \*